United States Patent [19]
Pollak

[11] Patent Number: 5,888,918
[45] Date of Patent: *Mar. 30, 1999

[54] METHOD FOR ENHANCING THE COLOR OF MINERALS USEFUL AS GEMSTONES

[76] Inventor: Richard Pollak, 3133 Via de Caballo, Encinitas, Calif. 92024

[ * ] Notice: This patent issued on a continued prosecution application filed under 37 CFR 1.53(d), and is subject to the twenty year patent term provisions of 35 U.S.C. 154(a)(2).

[21] Appl. No.: 845,709

[22] Filed: Apr. 25, 1997

[51] Int. Cl.$^6$ .......................... C30B 29/00; A44C 17/00; B05D 1/12; B05D 3/02
[52] U.S. Cl. .......................... 501/86; 427/180; 427/190; 427/191; 427/217; 427/383.1; 427/383.3; 63/32; 428/426; 428/432
[58] Field of Search ...................... 427/180, 190, 427/191, 217, 383.1, 383.3; 501/86; 428/426, 432, 539.5; 63/32

[56] References Cited

U.S. PATENT DOCUMENTS

| | | |
|---|---|---|
| 1,814,219 | 7/1931 | Jaeger et al. .............................. 63/32 |
| 3,539,379 | 11/1970 | Mayer ...................................... 117/69 |
| 3,616,357 | 10/1971 | Hayes ................................. 204/157.1 H |
| 3,950,596 | 4/1976 | Carr et al. ............................... 428/539 |
| 4,399,364 | 8/1983 | Evans et al. ........................... 250/492.1 |
| 4,621,065 | 11/1986 | Isogami et al. ........................... 501/86 |
| 4,678,868 | 7/1987 | Kraska et al. .................. 174/152 GM |
| 4,732,867 | 3/1988 | Schnable ................................... 437/22 |
| 4,749,869 | 6/1988 | Fournier ............................... 250/492.1 |
| 4,793,864 | 12/1988 | Neumiller et al. .......................... 134/1 |
| 4,820,562 | 4/1989 | Tanaka et al. .......................... 428/34.6 |
| 5,084,909 | 1/1992 | Pollak ...................................... 378/64 |
| 5,198,265 | 3/1993 | Iacovangelo et al. ............... 427/126.2 |
| 5,477,055 | 12/1995 | Skold et al. ......................... 250/492.1 |
| 5,637,878 | 6/1997 | Herer et al. .......................... 250/492.3 |

*Primary Examiner*—Shrive Beck
*Assistant Examiner*—Michael Barr
*Attorney, Agent, or Firm*—Gray Cary Ware & Freidenrich; Stephen E. Reiter

[57] ABSTRACT

In accordance with the present invention, there are provided methods for enhancing the color of minerals useful as gemstones. Invention methods are relatively inexpensive to carry out, avoid the use of hazardous materials, and require no specialized equipment.

20 Claims, No Drawings

5,888,918

METHOD FOR ENHANCING THE COLOR OF MINERALS USEFUL AS GEMSTONES

FIELD OF THE INVENTION

The present invention relates to methods for enhancing the color of gemstones and to novel colored gemstones produced by invention methods.

BACKGROUND OF THE INVENTION

A variety of materials having the physical and aesthetic properties desirable for use as gemstones are widely available. However, many of these materials but do not always have an aesthetically pleasing appearance. A variety of procedures have been employed in the art to improve the physical and/or aesthetic properties of minerals, e.g., electron beam irradiation, Cobalt-60 irradiation, neutron bombardment, exposure to intense heat, and the like.

Each of the above-described prior art methods suffer from significant drawbacks in terms of cost, safety, efficacy, and the like. Therefore, it would be desirable to be able to readily impart enhanced and/or modified color to materials useful as gemstones employing readily practiced methods which do not suffer from the drawbacks of prior art methods.

BRIEF DESCRIPTION OF THE INVENTION

In accordance with the present invention, methods have been developed for enhancing the color of minerals useful as gemstones. Invention methods are relatively inexpensive to carry out, avoid the use of hazardous materials and require no specialized equipment.

DETAILED DESCRIPTION OF THE INVENTION

In accordance with the present invention, there are provided methods for enhancing the color of gemstones, said methods comprising:

subjecting a combination of a gemstone and at least one powdered (i.e., finely divided) form of cobalt metal or cobalt oxide to conditions suitable to enhance the color of said gemstone, without causing a significant level of surface damage to said gemstone.

A wide variety of minerals can be treated according to the present invention. Examples of suitable minerals contemplated for use herein (thereby rendering them useful as gemstones) include topaz, chrysoberyl, sapphire, quartz, garnet, and the like.

A wide variety of metals can be employed in combination with the cobalt metal or cobalt oxide employed in the invention process. Examples of suitable metals include transition metals, as well as other metals which can modify the color imparted by the treating agent and/or the mineral being treated.

A wide variety of metal oxides can also be employed in combination with the cobalt metal or cobalt oxide employed in the invention process, optionally in further combination with a plurality of the metals set forth hereinabove. Examples of suitable metal oxides include transition metal oxides, as well as other metal oxides which can modify the color imparted by the treating agent and/or the mineral being treated.

Enhanced colors which can be imparted by the invention process can be varied based on such variables as the particular gemstone being treated, the particular treating agent(s) employed, the conditions to which the gemstones are subjected, and the like. For example, topaz can be modified to have a light blue to dark blue color, or a light green to dark green color, or a light blue-green to dark blue-green color, or a light green-blue to dark green-blue color, depending on the treating agent(s) and treating conditions employed. Similarly, chrysoberyl can be modified to have a light green to a deep blue-green color; sapphire can be modified to have a light blue to a dark blue color (if clear stones are used for treatment) or green, yellow-green or blue-green stones can be produced if the untreated stones are yellow; quartz can be modified to have a light pink to a dark pink color; garnet can be modified to have a green to a blue-green color; and the like.

A wide range of treating conditions can be employed in the practice of the present invention. Typically conditions suitable to enhance the color of a gemstone, without causing a significant level of surface damage thereto, comprise subjecting the combination of gemstone and at least one powdered (i.e., finely divided) form of cobalt metal or cobalt oxide to a temperature in the range of about 900° C. up to about 1250° C. for a time in the range of about 3 up to about 200 hours. Typically such contacting is carried out at ambient pressure.

Generally, longer exposure times and/or higher exposure temperatures lead to a greater intensity of color being imparted to the mineral being treated, as well as impacting the degree of color saturation achieved by the process. As readily recognized by those of skill in the art, higher treating temperatures are also possible (i.e., >1250° C.). Such temperatures are likely, however, to cause significant damage to the surface of the mineral being treated, while also providing higher color saturation. The resulting treated gemstone could be polished to remove the surface damage, thereby providing a color-enhanced gemstone with a satisfactory surface finish.

As readily recognized by those of skill in the art, the particular temperature ranges and exposure times will not only vary as a function of the intensity and/or level of color saturation desired, in adition, the ability of a given mineral to withstand such exposures without suffering significant fracturing must also be considered. Thus, for example, quartz would not typically be subjected to conditions as rigorous as topaz.

In a particular aspect of the invention, the gemstone to be treated can optionally be contacted with a variety of pre-treating agents (e.g., oxygen, reducing agents, and the like) before being subjected to the above-described conditions suitable to enhance the color of a gemstone.

Alternatively, or in combination with the above-described gemstone pretreatment, the gemstone can optionally be contacted with a variety of supplemental treating agents (e.g., oxygen, reducing agents, and the like) while being subjected to the above-described conditions suitable to enhance the color of a gemstone.

An optional additional treatment contemplated for use herein comprises subjecting the treated gemstone to further heating at a temperature in the range of about 900° C. up to about 1250° C. for an additional length of time in the range of about 3 up to about 200 hours in the absence of treating agent (i.e., powdered cobalt metal or cobalt oxide) . Typically such optional additional heat treatment is carried out at ambient pressure.

While gemstones can be used in the invention treating process without any special pretreatment, it is presently preferred that gemstones employed in the practice of the invention be cleaned prior to being subjected to said conditions suitable to enhance the color thereof. Suitable cleaning processes are well known to those of skill in the art, and include washing in water, aqueous acid, organic media, and the like.

Gemstones treated according to the present invention can be used directly, or they can be subjected to further treatment and/or washing conditions. It is presently preferred that the treated gemstone be cleaned after being subjected to said conditions suitable to enhance the color of a gemstone. Such cleaning can be accomplished in a variety of ways, e.g., by washing the treated gemstones with aqueous media or with organic solvents (e.g., acetone), by wiping the gemstones with a soft cloth (e.g., a polishing cloth), by polishing the surface of the gemstones with a suitable abrasive, and the like.

In accordance with another embodiment of the present invention, there are provided color enhanced gemstones having a color enhancing agent diffused into the outer surface thereof. Color enhancing agents contemplated include the treating agents described hereinabove.

In accordance with yet another embodiment of the present invention, there are provided color enhanced gemstones wherein at least the surface of said gemstone has chemically bonded thereto a color enhancing agent. Color enhancing agents contemplated include the treating agents described hereinabove.

The invention will now be described in greater detail by reference to the following non-limiting examples.

EXAMPLE 1
Optional Cleaning Process

It is presently preferred that gemstones treated in accordance with the present invention be cleaned as follows. First the stones are treated in gently boiling distilled water containing a small amount of detergent for at least about 12 hours. Once cooled, the stones are then washed with distilled water until all traces of detergent are removed.

The stones are then soaked at room temperature (or above) in a 1:1 aqueous dilution of concentrated nitric acid for about two hours, or more. The stones are then rinsed thoroughly with distilled water. The stones are then rinsed with acetone, then rinsed again with distilled water, and dried.

EXAMPLE 2
General Treatment Protocol

To achieve color enhancement according to the invention, gemstones are placed in a suitable vessel which can withstand the exposure temperatures contemplated for use (e.g., a flat ceramic sheet, a crucible, and the like) and completely surrounded by the treating agent(s) of choice. The vessel is then placed in a furnace capable of reaching and accurately maintaining temperatures in the range of about 900° up to about 1800° C. The furnace is then heated to the desired temperature and maintained at that temperature for the desired length of time. Once the desired time and temperature requirements have been satisfied, the furnace is cooled down and the vessel containing the gemstones is removed therefrom.

After the treated gemstones have cooled, they are separated from the treating agent. In many instances, the treated stones need only be wiped clean with a soft cloth or tissue. In some circumstances (e.g., where the stones are subjected to particularly rigorous treating conditions or where relatively soft stones are treated), it may be desirable to subject the stone to a nitric acid bath to clean the surface of the stone. When such treatment is indicated, concentrated nitric acid solutions or various dilutions thereof can be used.

EXAMPLE 3
Treatment of Topaz

Topaz can be treated with powdered cobalt metal or cobalt oxide to achieve a variety of enhanced colors. For example, treatment at 900° C. for about 24 hours results in very light blue stones. Treatment at higher temperature (e.g., 1046° C.) for about 24 hours results in much darker blue or blue-green stones. Thus, it is seen that the final color of the treated stone can be controlled by proper selection of treating conditions.

Once topaz is treated with powdered cobalt metal or cobalt oxide as described above to achieve a green-blue or blue-green stone, the color imparted to the stone can be further modified by subjecting the stones to additional furnace heating as described above, but in the absence of treating agent. In this way, the color of the stone can be shifted to blue.

EXAMPLE 4
Treatment of Chrysoberyl

Chrysoberyl is subjected to the same process as described in Example 3. Since the most common color for chrysoberyl is light yellow, the color of the treated stone tends to be yellow-green to blue-green, depending upon the time and temperature of exposure. If a colorless chrysoberyl is used in the process, the enhanced color imparted by treatment with powdered cobalt metal or cobalt oxide is blue.

EXAMPLE 5
Treatment of Sapphire

Sapphire is subjected to the same process as described in Example 3. Care should be taken in selecting the temperature to which the stones are heated, as sapphires tend to develop surface damage when subjected to excessive temperatures. In the event surface damage does occur, the treated stones can be repolished, producing an intensely colored finished product.

The color of the treated stone can vary substantially. For example, a colorless sapphire produces a light blue to dark blue treated stone, depending upon the original color of the sapphire. A yellow saphire will produce a green, yellow-green to blue-green stone, depending upon the time and temperature of exposure. If a colorless chrysoberyl is used in the process, the enhanced color imparted by treatment with powdered cobalt metal or cobalt oxide is blue.

EXAMPLE 6
Treatment of Quartz

Quartz is subjected to the same process as described in Example 3. Care should be taken in selecting the temperature to which the stones are heated, as quartz tends to develop surface damage when subjected to excessive temperatures. In the event surface damage does occur, the treated stones can be repolished, producing a smooth, colored finished product.

The color of the treated stone can vary substantially, with the invention process typically producing stones which are light to dark pink.

EXAMPLE 7
Treatment of Garnet

Garnet is subjected to the same process as described in Example 3. The color of the treated stone can vary substantially, with the invention process typically producing stones which are green to blue-green when light yellow grossular garnet is used.

While the invention has been described in detail with reference to certain preferred embodiments thereof, it will be understood that modifications and variations are within the spirit and scope of that which is described and claimed.

That which is claimed is:

1. A method for enhancing the color of gemstone(s), said method comprising: subjecting a combination of a gemstone and at least one tang agent to a temperature in the range of about 900° C. up to about 1250° C., for a time in the range of about 3 up to about 200 hours, under conditions suitable to enhance the color of said gemstone, wherein said treating agent comprises a finely divided form of cobalt or cobalt oxide, and wherein said gemstone is topaz, quartz or garnet.

2. A method according to claim 1, wherein said treating agent is cobalt.

3. A method accord to claim 1, wherein said treating agent is cobalt oxide.

4. A method according to claim 1, wherein said gemstone is cleaned prior to being subjected to said conditions suitable to enhance the color of said gemstone.

5. A method according to claim 1, wherein subsequent to said treatment in the presence of treating agent, said gemstone is subjected to a temperature in the range of about 900° C. up to about 1250° C. for a time in the range of about 3 up to about 200 hours in the absence of said treating agent.

6. A method according to claim 1, wherein said gemstone is cleaned after being subjected to said conditions suitable to enhance the color of said gemstone.

7. A color enhanced gemstone prepared by the method of claim 1.

8. A method for enhancing the color of gemstone(s), said method comprising: subjecting a combination of a gemstone and at least one treating agent to a temp in the range of about 900° C. up to about 1250° C., for a time in the range of about 3 up to about 200 hours, under conditions suitable to enhance the color of said gemstone, wherein said treating agent consists essentially of a finely divided form of cobalt or cobalt oxide, and wherein said gemstone is topaz, chrysoberyl, sapphire, quartz or garnet.

9. A method according to claim 8, wherein said treating agent is cobalt.

10. A method according to claim 8, wherein said treating agent is cobalt oxide.

11. A method according to claim 8, wherein said gemstone is cleaned prior to being subjected to said conditions suitable to enhance the color of said gemstone.

12. A method according to claim 8, wherein subsequent to said treatment in the presence of treating agent, said gemstone is subjected to a temperature in the range of about 900° C. up to about 1250° C. for a time in the range of about 3 up to about 200 hours in the absence of said treating agent.

13. A method according to claim 8, wherein said gemstone is cleaned after being subjected to said conditions suitable to enhance the color of said gemstone.

14. A color enhanced gemstone prepared by the method of claim 8, wherein said gemstone is topaz, quartz or garnet.

15. A color enhanced gemstone comprising a gemstone having a color enhancing agent diffused into the outer surface thereof, wherein said gemstone is topaz, quartz, or garnet and said agent is cobalt and/or cobalt oxide.

16. A color enhanced gemstone according to claim 15, wherein said enhanced color is blue-green or green.

17. A color gemstone according to claim 15, wherein said gemstone is topaz, and said enhanced color is blue.

18. A color enhanced gemstone comprising a gemstone wherein at least the surface has chemically bonded thereto a color enhancing agent, wherein said gemstone is topaz, chrysoberyl, quartz or garnet and said agent is cobalt and/or cobalt oxide.

19. A color enhanced gemstone according to claim 18, wherein said enhanced color is blue-green or green.

20. A color enhanced gemstone according to claim 18, wherein said gemstone is topaz, and said enhanced color is blue.

* * * * *